(12) United States Patent
Blechschmidt et al.

(10) Patent No.: US 12,175,162 B2
(45) Date of Patent: Dec. 24, 2024

(54) OBJECT RELATIONSHIP ESTIMATION FROM A 3D SEMANTIC MESH

(71) Applicant: Apple Inc., Cupertino, CA (US)

(72) Inventors: Angela Blechschmidt, San Jose, CA (US); Daniel Ulbricht, Sunnyvale, CA (US); Omar Elafifi, Oakland, CA (US)

(73) Assignee: APPLE INC., Cupertino, CA (US)

( * ) Notice: Subject to any disclaimer, the term of this patent is extended or adjusted under 35 U.S.C. 154(b) by 989 days.

(21) Appl. No.: 16/984,406

(22) Filed: Aug. 4, 2020

(65) Prior Publication Data

US 2021/0073429 A1 Mar. 11, 2021

Related U.S. Application Data

(60) Provisional application No. 62/898,049, filed on Sep. 10, 2019.

(51) Int. Cl.
*G06F 30/10* (2020.01)
*G06N 3/08* (2023.01)
*G06N 20/00* (2019.01)

(52) U.S. Cl.
CPC .............. *G06F 30/10* (2020.01); *G06N 3/08* (2013.01); *G06N 20/00* (2019.01)

(58) Field of Classification Search
CPC ........... G06F 30/10; G06N 20/00; G06N 3/08
USPC ............................................................ 703/2
See application file for complete search history.

(56) References Cited

U.S. PATENT DOCUMENTS

| | | | |
|---|---|---|---|
| 6,919,891 B2* | 7/2005 | Schneider | G06T 17/005 |
| | | | 715/236 |
| 9,219,922 B2* | 12/2015 | Brockmann | H04N 19/54 |
| 9,558,467 B1 | 1/2017 | Simon | |
| 9,773,177 B2* | 9/2017 | Takemura | G06V 20/58 |
| 2012/0150797 A1 | 6/2012 | Landy | |
| 2013/0218349 A1 | 8/2013 | Coogan | |
| 2017/0318407 A1* | 11/2017 | Meister | H04S 7/303 |
| 2017/0357878 A1* | 12/2017 | Sawhney | G06V 20/35 |
| 2018/0184178 A1* | 6/2018 | Hoeben | G06F 16/986 |
| 2018/0189974 A1* | 7/2018 | Clark | G06N 3/04 |

(Continued)

FOREIGN PATENT DOCUMENTS

| | | |
|---|---|---|
| CN | 103345536 A | 10/2013 |
| CN | 106650915 A | 5/2017 |

(Continued)

OTHER PUBLICATIONS

Mo et al. (StructureNet: Hierarchical Graph Networks for 3D Shape Generation, 2019, arXiv, pp. 1-29) (Year: 2019).*

(Continued)

*Primary Examiner* — Iftekhar A Khan
(74) *Attorney, Agent, or Firm* — Thompson Hine LLP

(57) ABSTRACT

Implementations disclosed herein provide systems and methods that determine relationships between objects based on an original semantic mesh of vertices and faces that represent the 3D geometry of a physical environment. Such an original semantic mesh may be generated and used to provide input to a machine learning model that estimates relationships between the objects in the physical environment. For example, the machine learning model may output a graph of nodes and edges indicating that a vase is on top of a table or that a particular instance of a vase, V1, is on top of a particular instance of a table, T1.

20 Claims, 11 Drawing Sheets

(56) References Cited

U.S. PATENT DOCUMENTS

| | | | |
|---|---|---|---|
| 2019/0043203 A1* | 2/2019 | Fleishman | G06F 18/29 |
| 2019/0087480 A1 | 3/2019 | Palanciuc | |
| 2020/0082198 A1* | 3/2020 | Yao | G06F 18/24143 |
| 2020/0302686 A1* | 9/2020 | Totty | G06T 17/00 |
| 2020/0349763 A1* | 11/2020 | Chen | G06T 7/73 |
| 2021/0025727 A1* | 1/2021 | Barnes | G06T 7/73 |

FOREIGN PATENT DOCUMENTS

| | | |
|---|---|---|
| CN | 106709481 A | 5/2017 |
| CN | 109376581 A | 2/2019 |
| WO | 2019/067476 A2 | 4/2019 |

OTHER PUBLICATIONS

Valentin et al. (Mesh Based Semantic Modelling for Indoor and Outdoor Scenes, 2013, Oxford Brookes University, pp. 1-8) (Year: 2013).*

Armeni et al. ("Joint 2D-3D-Semantic Data for Indoor Scene Understanding", 2017, pp. 1-9) (Year: 2017).*

Chen, Kang; Lai, Yu-Kun; Wu, Yu-Xin; Martin, Ralph; Hu, Shi-Min; "Automatic Semantic Modeling of Indoor Scenes from Low-quality RGB-D Data Using Contextual Information"; ACM Transactions on Graphics, vol. 33, No. 6, Article 208, Publication Date: Nov. 2014; p. 208:1-208:12.

Korean Intellectual Property Office, Notice of Preliminary Rejection (with English translation), Korean Patent Application No. 10-2020-0112149, 9 pages, Jun. 21, 2021.

Valentin, J.P.C. et al., "Mesh Based Semantic Modelling for Indoor and Outdoor Scenes," 8 pages, 2013.

Lin Jin-hua et al., "Three-dimentional reconstruction of semantic scene based on RGB-D map", Optics and Precision Engineering, vol. 26, No. 5, 2018.

Pan Le-Yun et al., "A Multi-Strategy Learning Based Ontology Matching Method on the Semantic Grid", Journal of Computer Research and Development, vol. 41, No. 12, 2004.

Yimin, Zou et al., "Identifying Important Objects from the Web Resources Based on Knowledge Object Grid", Journal of the China Society for Scientific and Technical Information, ISSN 1000-0135, vol. 33 No. 3, pp. 250-258, 2014.

China National Intellectual Property Administration, Notification of the First Office Action (with English translation), Chinese Patent Application No. 202010939015.X, 19 pages, Apr. 4, 2024.

China National Intellectual Property Administration, Notification of Second Office Action (with English translation), Chinese Patent Application No. 202010939015.X, 18 pages, Jul. 27, 2024.

* cited by examiner

OBJECT RELATIONSHIP ESTIMATION FROM A 3D SEMANTIC MESH

CROSS-REFERENCE TO RELATED APPLICATIONS

This application claims the benefit of U.S. Provisional Application Ser. No. 62/898,049 filed Sep. 10, 2019, which is incorporated herein in its entirety.

TECHNICAL FIELD

The present disclosure generally relates to determining objects and relationships between objects in physical environments and, in particular, to systems, methods, and devices that use machine learning to estimate relationships and classify objects in physical environments.

BACKGROUND

Various computer vision techniques are used to identify physical objects in physical environments. For example, images captured by a camera may be automatically evaluated to determine that the physical environment includes a table, a chair, and a vase. Such techniques, however, may provide little or no information about the relationships between objects. For example, the techniques may not determine that a vase is on top of a table or that a chair is next to and facing a table.

SUMMARY

Implementations disclosed herein provide systems and methods that determine relationships between objects based on an original semantic mesh of vertices and faces that represent the 3D geometry of a physical environment. Such an original semantic mesh may be generated and used to provide input to a machine learning model that estimates relationships between the objects in the physical environment. For example, the machine learning model may output a graph of nodes and edges indicating that a vase is on top of a table or that a particular instance of a vase, V1, is on top of a particular instance of a table, T1.

Some implementations provide a method of estimating or otherwise determining relationships between objects in a physical environment. The exemplary method may be implemented by a computing device executing instructions using a processor. The method generates a semantic mesh of vertices and faces. The 3D shape of the semantic mesh represents the 3D geometry of surfaces of objects of a physical environment. In addition, at least some of the vertices have semantic labels identifying object type (e.g., table, chair, vase, etc.). In such a semantic mesh, for example, vertices on the floor surface may be labelled "floor" and vertices on a chair's surfaces may be labelled "chair." Adjacent vertices in the semantic mesh form faces, e.g., three "floor" vertices may define a face representing a portion of the surface of the floor. Each vertex may store or otherwise be associated with a location, e.g., x,y,z positional information.

One or more machine learning algorithms may be used to generate a semantic mesh. A semantic mesh may be generated, in some implementations, based on a set of one or more image of the physical environment, for example, using three dimensional (3D) reconstruction techniques (e.g., algorithms or machine learning models) that provide a 3D triangle mesh representing surfaces of the physical environment and/or semantic image segmentation techniques (e.g., algorithms or machine learning models) to annotate or classify objects of the physical environment.

The method may transform the original semantic mesh into a graph having nodes and edges determined based on the vertices and faces of the semantic mesh. The graph may be represented in full or in a reduced form. For example, the method may perform a reduction technique to reduce the complexity of the graph by reducing the number of nodes.

The method estimates relationships between objects using one or more machine learning models. In some implementations, the method inputs a representation of the graph (e.g., the full graph or a reduced version of the graph) into one or more machine learning models (e.g., neural networks). The method may additionally classify objects or updates previously-determined object classification labels using one or more machine learning models based on the representation of the graph and/or the estimated relationships. In some implementations, the method classifies objects or updates classification labels. Using a reduced representation of the original semantic mesh (e.g., a reduced graph) as input to the machine learning model(s) may improve the accuracy and efficiency of the machine learning model(s). Using a reduced version as input may allow accurate results to be obtained using a representation of a semantic mesh (e.g., an graph or reduced graph) rather than using a random or all nodes connected initialization. In some implementations, the machine learning model(s) output a graph representing the objects and their relationships. In some implementations, the machine learning model(s) output pairwise relationships between objects.

In some implementations, the relationships between objects that are produced by a machine learning model are estimates using probabilities, e.g., providing a 99% chance that table T1 is on top of floor F1, a 90% chance that container C1 on top of table T1, a 75% chance that chair C1 is next to table T1, a 75% chance that chair C2 is facing television TV1, a 75% chance that handle H1 is attached to door D1, etc.

Some implementations disclosed herein provide systems and methods that generate synthetic data such as semantic meshes that are similar to scanned meshes of real physical environments and that have objects with known/labelled relationships. Such synthetic data may be used to train a machine learning model to classify objects and determine relationships from semantic meshes using the techniques disclosed herein and for various other purposes. One exemplary method may be implemented by a computing device executing instructions using a processor. The method models multiple meshes for separate objects of a synthetic environment (e.g., individual meshes for each of a chair, a table, a floor, etc.). Each of the separate objects is associated with an object type and has a separate mesh that includes semantic labels (e.g., the chair mesh includes nodes that are all labelled "chair"). In some implementation, a user creates a synthetic room by separately creating or inserting a floor, chairs, tables, walls, etc.

The method determines a volume representation based on the plurality of meshes, e.g., based on all of the meshes that a user created for a synthetic room. For example, this may involve converting the individual meshes of the separate objects to form a single density cloud or set of points that represent all of the meshes. The method then determines a combined mesh based on the volume representation. For example, a density cloud that was generated from the multiple, individual meshes may be converted back into a single mesh that represents all of the objects.

The method also determines relationships between the separate objects of the single mesh. For example, relationships may be determined based on manually inputted information from the synthetic scene creator or automatically based on evaluating the separate meshes or the single mesh. The single mesh, the identification of the synthetic objects known to be represented by the mesh, and/or the relationships between such object may then be provided to train a machine learning model to classify objects and estimate relationships from semantic meshes using the techniques disclosed herein and for various other purposes. In some implementations, a machine learning model is trained to receive a semantic mesh (or reduced version of a semantic mesh) and produce output that identifies the relationships between the objects represented in the semantic mesh (or reduced version of a semantic mesh).

In accordance with some implementations, a non-transitory computer readable storage medium has stored therein instructions that are computer-executable to perform or cause performance of any of the methods described herein. In accordance with some implementations, a device includes one or more processors, a non-transitory memory, and one or more programs; the one or more programs are stored in the non-transitory memory and configured to be executed by the one or more processors and the one or more programs include instructions for performing or causing performance of any of the methods described herein.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

Figure 1:
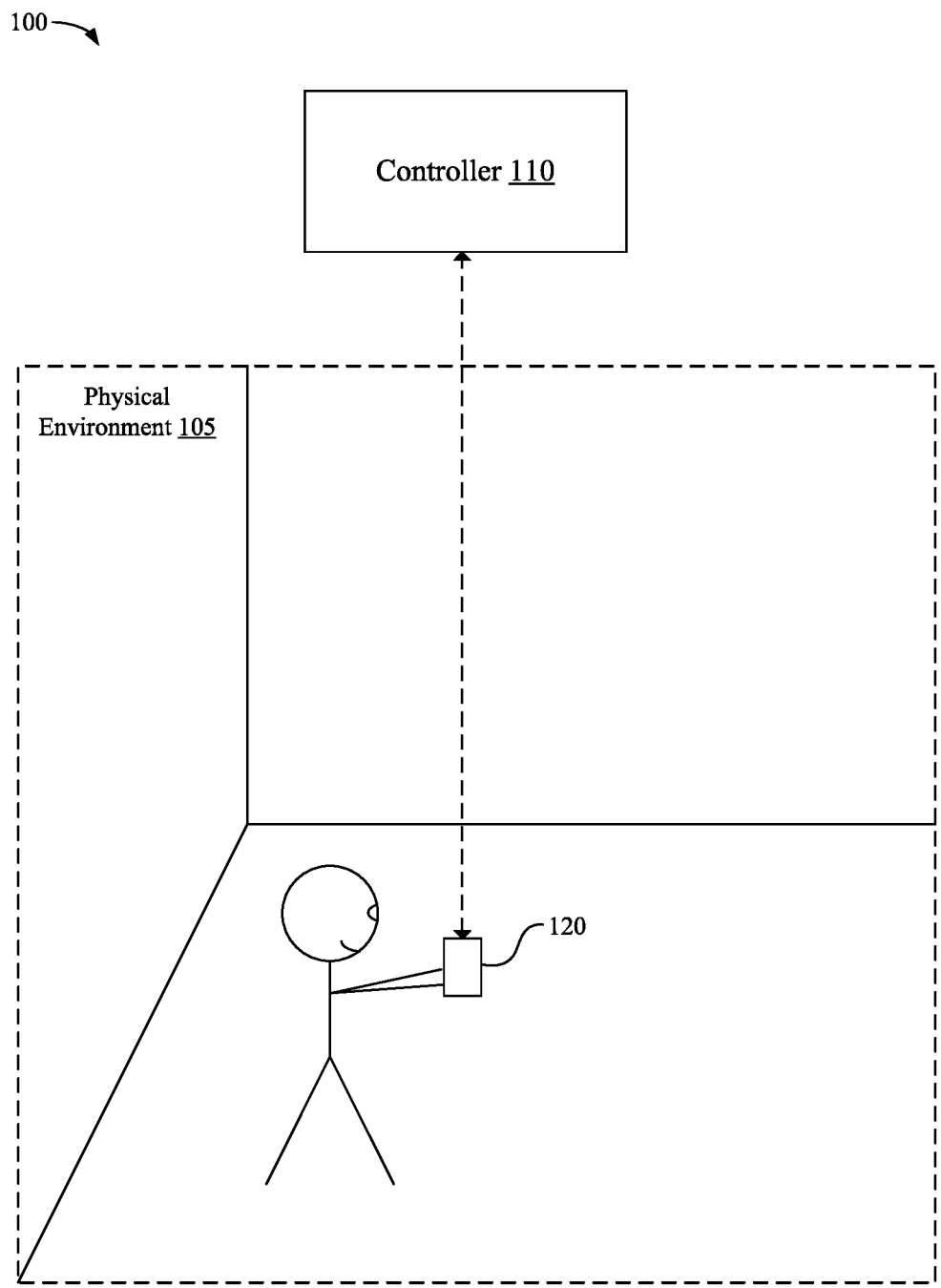
FIG. 1 is a block diagram of an example operating environment in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION

Figure 2:
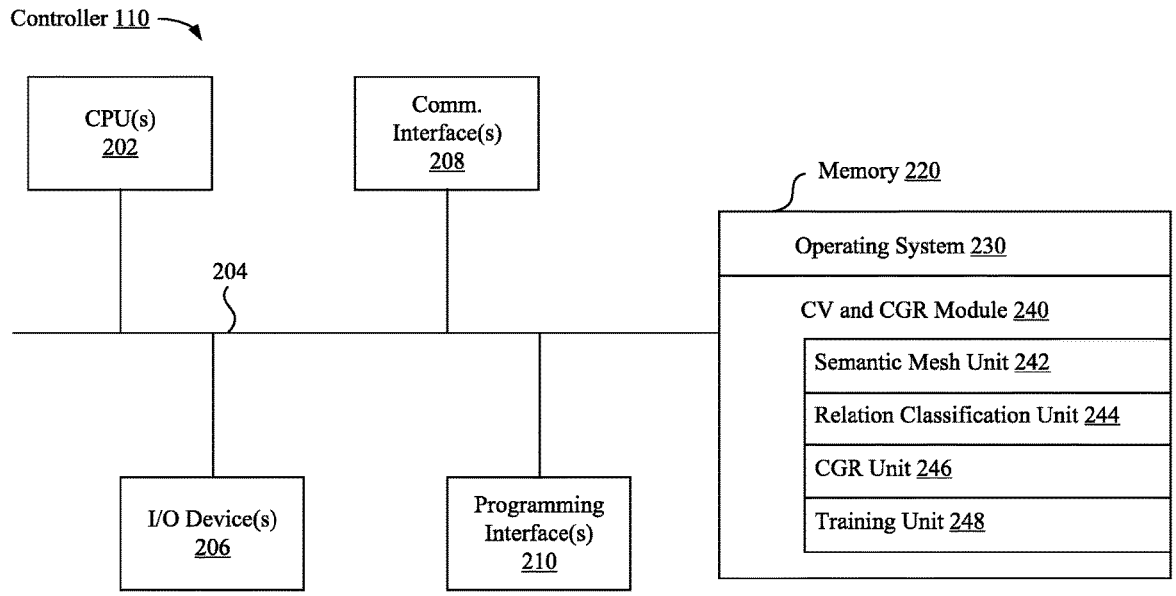
FIG. 2 is a block diagram of an example controller in accordance with some implementations.
Figure 3:
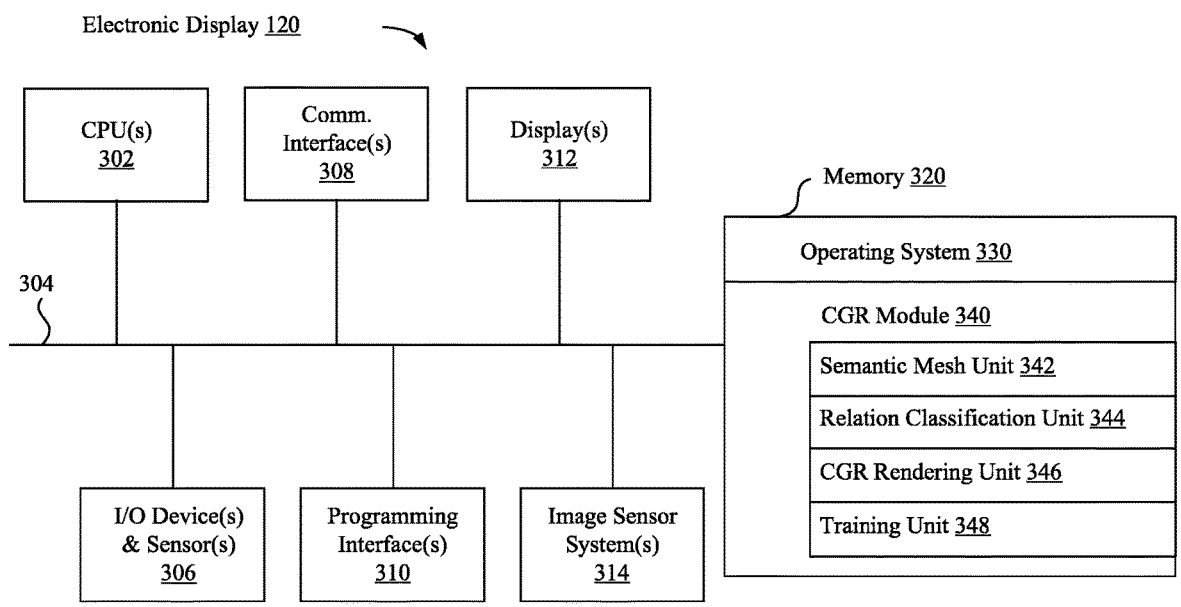
FIG. 3 is a block diagram of an example electronic device in accordance with some implementations.

Numerous details are described in order to provide a thorough understanding of the example implementations shown in the drawings. However, the drawings merely show some example aspects of the present disclosure and are therefore not to be considered limiting. Those of ordinary skill in the art will appreciate that other effective aspects or variants do not include all of the specific details described herein. Moreover, well-known systems, methods, components, devices and circuits have not been described in exhaustive detail so as not to obscure more pertinent aspects of the example implementations described herein. While FIGS. 1-3 depict exemplary implementations involving a handheld electronic device, other implementations do not necessarily involve a handheld device and may involve other types of devices including, but not limited to, televisions, set-top devices, laptops, desktops, gaming devices, home automation devices, watches, head-mounted devices (HMDs), and other wearable electronic devices, and other devices that process or display content.

FIG. 1 is a block diagram of an example operating environment 100 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the operating environment 100 includes a controller 110 and an electronic device 120, one or both of which may be in a physical environment.

The electronic device 120 is configured to process or display content. In some implementations, the electronic device 120 includes a suitable combination of software, firmware, or hardware. The content may be provided for display on the electronic device 120 from a recorded source or a live source. For example, content may be stored in a memory on the electronic device 120, the controller 110, or elsewhere. In another example, content may be a stream of frames captured or processed in real time by a camera on the electronic device 120, the controller 110, or elsewhere. The electronic device 120 is described in greater detail below with respect to FIG. 3. In some implementations, the functionalities of the controller 110 are provided by or combined with the electronic device 120, for example, in the case of an electronic device that functions as a stand-alone unit.

In some implementations, the controller 110 is a computing device that is local or remote relative to the physical environment 105. In one example, the controller 110 is a local server located within the physical environment 105. In another example, the controller 110 is a remote server located outside of the physical environment 105 (e.g., a cloud server, central server, etc.). In some implementations, the controller 110 is communicatively coupled with the electronic device 120 via one or more wired or wireless communication channels 144 (e.g., BLUETOOTH, IEEE 802.11x, IEEE 802.16x, IEEE 802.3x, etc.).

FIG. 2 is a block diagram of an example of the controller 110 in accordance with some implementations. While certain specific features are illustrated, those skilled in the art will appreciate from the present disclosure that various other features have not been illustrated for the sake of brevity, and so as not to obscure more pertinent aspects of the implementations disclosed herein. To that end, as a non-limiting example, in some implementations the controller 110 includes one or more processing units 202 (e.g., microprocessors, application-specific integrated-circuits (ASICs), field-programmable gate arrays (FPGAs), graphics processing units (GPUs), central processing units (CPUs), processing cores, or the like), one or more input/output (I/O) devices 206, one or more communication interfaces 208 (e.g., universal serial bus (USB), FIREWIRE, THUNDERBOLT, IEEE 802.3x, IEEE 802.11x, IEEE 802.16x, global system for mobile communications (GSM), code division multiple access (CDMA), time division multiple access (TDMA), global positioning system (GPS), infrared (IR), BLUETOOTH, ZIGBEE, or the like type interface), one or more programming (e.g., I/O) interfaces 210, a memory 220, and one or more communication buses 204 for interconnecting these and various other components.

In some implementations, the one or more communication buses 204 include circuitry that interconnects and controls communications between system components. In some implementations, the one or more I/O devices 206 include at least one of a keyboard, a mouse, a touchpad, a joystick, one or more microphones, one or more speakers, one or more image capture devices or other sensors, one or more displays, or the like.

The memory 220 includes high-speed random-access memory, such as dynamic random-access memory (DRAM), static random-access memory (SRAM), double-data-rate random-access memory (DDR RAM), or other random-access solid-state memory devices. In some implementations, the memory 220 includes non-volatile memory, such as one or more magnetic disk storage devices, optical disk storage devices, flash memory devices, or other non-volatile solid-state storage devices. The memory 220 optionally includes one or more storage devices remotely located from the one or more processing units 202. The memory 220 comprises a non-transitory computer readable storage medium. In some implementations, the memory 220 or the non-transitory computer readable storage medium of the memory 220 stores the following programs, modules and data structures, or a subset thereof including an optional operating system 230 and a computer vision (CV) and computer generated reality (CGR) module 240.

The operating system 230 includes procedures for handling various basic system services and for performing hardware dependent tasks.

In some implementations, the CV and CGR module 240 includes a semantic mesh unit 242, an relation classification unit 244, a CGR unit 246, and a training unit 248. The semantic mesh unit 242 may be configured to generate a semantic mesh, for example, using 3D reconstruction techniques (e.g., algorithms or machine learning models) that provide a 3D triangle mesh representing surfaces of a physical environment and/or semantic image segmentation techniques (e.g., algorithms or machine learning models) to annotate or classify objects of the physical environment. The semantic mesh unit 242 may be configured to reduce a semantic mesh, for example, by reducing the number of vertices/nodes in the semantic mesh via the techniques disclosed herein.

The relation classification unit 244 may be configured to classify objects and estimate relationships between the objects, for example, using a machine learning model (e.g., neural network) that uses a representation of an original semantic mesh provided by the semantic mesh unit 242.

The CGR unit 246 may be configured to render CGR environments that include depictions of the physical environment, virtual content, or both. The CGR unit 246 may be configured to utilize objects and/or relationships classified or estimated by the relation classification unit 244. For example, the CGR unit 246 may respond to a user's voice command to place a virtual vase on "the table next to the window" based on a relationship defining that table T3 is next to window W2, e.g., it knows to put the virtual vase on table T3 rather than another table that is not next to a window.

The training unit 248 may be configured to generate synthetic data such as semantic meshes that are similar to scanned meshes of real physical environments and that have objects with known/labelled relationships. Such synthetic data may be used to train a machine learning model of the relation classification unit 244 to classify objects and estimate relationships from semantic meshes generated based on images of a physical environment by semantic mesh unit 242.

Although these modules and units are shown as residing on a single device (e.g., the controller 110), it should be understood that in other implementations, any combination of these modules and units may be located in separate computing devices. Moreover, FIG. 2 is intended more as functional description of the various features which are present in a particular implementation as opposed to a structural schematic of the implementations described herein. As recognized by those of ordinary skill in the art, items shown separately could be combined and some items could be separated. For example, some functional modules shown separately in FIG. 2 could be implemented in a single module and the various functions of single functional blocks could be implemented by one or more functional blocks in various implementations. The actual number of modules and the division of particular functions and how features are allocated among them will vary from one implementation to another and, in some implementations, depends in part on the particular combination of hardware, software, or firmware chosen for a particular implementation.

FIG. 3 is a block diagram of an example of the electronic device 120 in accordance with some implementations. While certain specific features are illustrated, those skilled in the art will appreciate from the present disclosure that various other features have not been illustrated for the sake of brevity, and so as not to obscure more pertinent aspects of the implementations disclosed herein. To that end, as a non-limiting example, in some implementations the electronic device 120 includes one or more processing units 302 (e.g., microprocessors, ASICs, FPGAs, GPUs, CPUs, processing cores, or the like), one or more input/output (I/O) devices and sensors 306, one or more communication interfaces 308 (e.g., USB, FIREWIRE, THUNDERBOLT, IEEE 802.3x, IEEE 802.11x, IEEE 802.16x, GSM, CDMA, TDMA, GPS, IR, BLUETOOTH, ZIGBEE, SPI, I2C, or the like type interface), one or more programming (e.g., I/O) interfaces 310, one or more displays 312, one or more interior or exterior facing image sensor systems 314, a memory 320, and one or more communication buses 304 for interconnecting these and various other components.

In some implementations, the one or more communication buses 304 include circuitry that interconnects and controls communications between system components. In some implementations, the one or more I/O devices and sensors 306 include at least one of an inertial measurement unit (IMU), an accelerometer, a magnetometer, a gyroscope, a thermometer, one or more physiological sensors (e.g., blood pressure monitor, heart rate monitor, blood oxygen sensor, blood glucose sensor, etc.), one or more microphones, one or more speakers, a haptics engine, one or more depth sensors (e.g., a structured light, a time-of-flight, or the like), or the like.

In some implementations, the one or more displays 312 are configured to present an CGR experience to the user. In some implementations, the one or more displays 312 correspond to holographic, digital light processing (DLP), liquid-crystal display (LCD), liquid-crystal on silicon (LCoS), organic light-emitting field-effect transitory (OLET), organic light-emitting diode (OLED), surface-conduction electron-emitter display (SED), field-emission display (FED), quantum-dot light-emitting diode (QD-LED), micro-electromechanical system (MEMS), or the like display types. In some implementations, the one or more displays 312 correspond to diffractive, reflective, polarized, holographic, etc. waveguide displays. For example, the electronic device 120 includes a single display. In another example, the electronic device 120 includes a display for each eye of the user.

The memory 320 includes high-speed random-access memory, such as DRAM, SRAM, DDR RAM, or other random-access solid-state memory devices. In some implementations, the memory 320 includes non-volatile memory, such as one or more magnetic disk storage devices, optical disk storage devices, flash memory devices, or other non-volatile solid-state storage devices. The memory 320 optionally includes one or more storage devices remotely located from the one or more processing units 302. The memory 320 comprises a non-transitory computer readable storage medium. In some implementations, the memory 320 or the non-transitory computer readable storage medium of the memory 320 stores the following programs, modules and data structures, or a subset thereof including an optional operating system 330 and a computer vision (CV) and computer generated reality (CGR) module 340.

The operating system 330 includes procedures for handling various basic system services and for performing hardware dependent tasks.

In some implementations, the CV and CGR module 340 includes a semantic mesh unit 342, an relation classification unit 344, a CGR unit 346, and a training unit 248. The semantic mesh unit 342 may be configured to generate a semantic mesh, for example, using 3D reconstruction techniques (e.g., algorithms or machine learning models) that provide a 3D triangle mesh representing surfaces of a physical environment and/or semantic image segmentation techniques (e.g., algorithms or machine learning models) to annotate or classify objects of the physical environment. The semantic mesh unit 342 may be configured to reduce a semantic mesh, for example, by reducing the number of vertices/nodes in the semantic mesh via the techniques disclosed herein.

The relation classification unit 344 may be configured to classify objects and estimate relationships between the objects, for example, using a machine learning model (e.g., neural network) that uses a representation of the original semantic mesh provided by the semantic mesh unit 342.

The CGR unit 346 may be configured to render CGR environments that include depictions of the physical environment and/or virtual content. The CGR unit 346 may be configured to utilize objects and/or relationships determined by the relation classification unit 344. For example, the CGR unit 346 may respond to a user's voice command to place a virtual vase on "the table next to the window" based on a relationship defining that table T3 is next to window W2.

The training unit 348 may be configured to generate synthetic data such as semantic meshes that are similar to scanned meshes of real physical environments and that have objects with known/labelled relationships. Such synthetic data may be used to train a machine learning model of the relation classification unit 344 to classify objects and estimate relationships from semantic meshes generated based on images of a physical environment by semantic mesh unit 342.

Moreover, FIG. 3 is intended more as a functional description of the various features which are present in a particular implementation as opposed to a structural schematic of the implementations described herein. As recognized by those of ordinary skill in the art, items shown separately could be combined and some items could be separated. For example, some functional modules shown separately in FIG. 3 could be implemented in a single module and the various functions of single functional blocks could be implemented by one or more functional blocks in various implementations. The actual number of modules and the division of particular functions and how features are allocated among them will vary from one implementation to another and, in some implementations, depends in part on the particular combination of hardware, software, or firmware chosen for a particular implementation.

Figure 4:
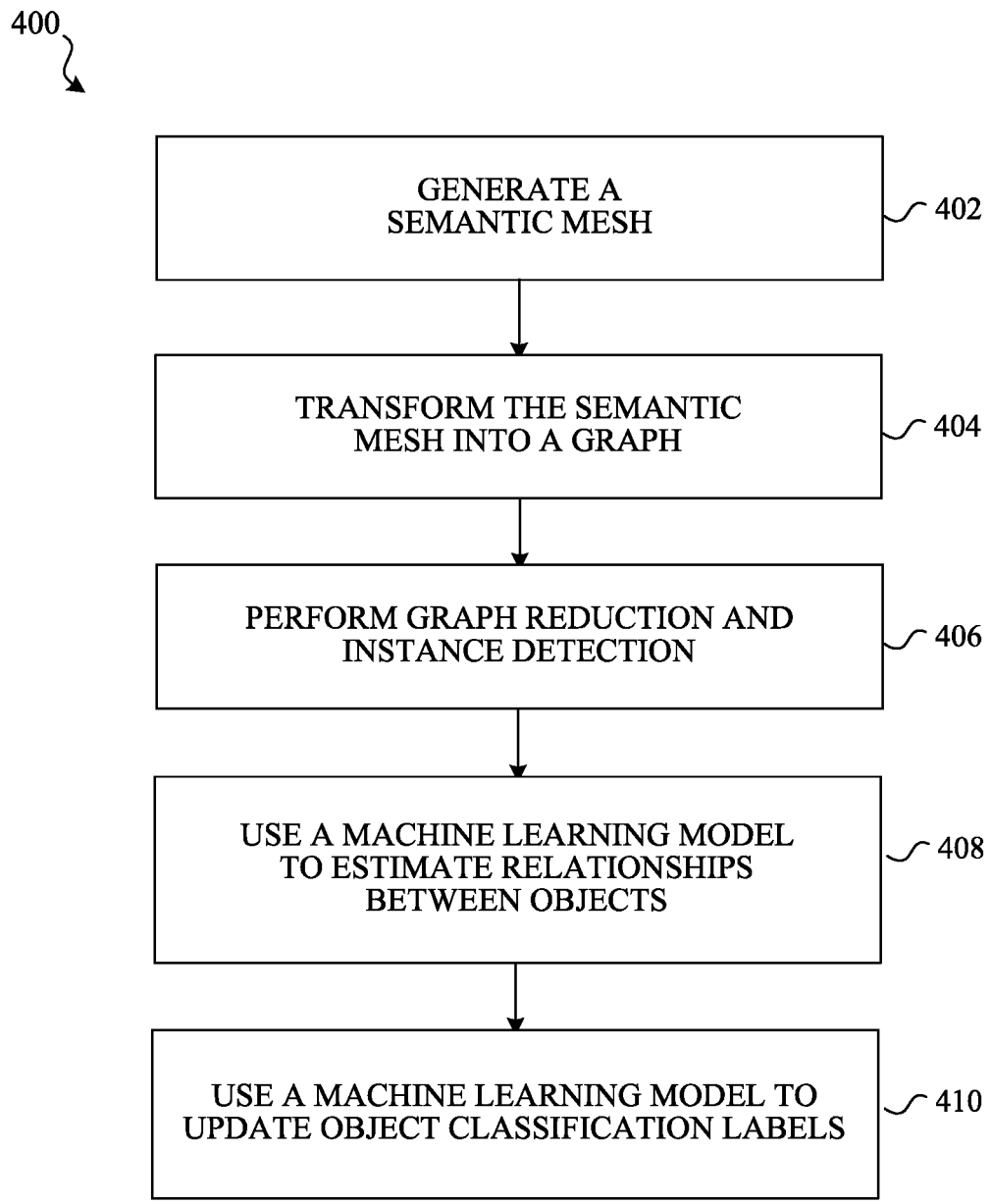
FIG. 4 is a flowchart illustrating an exemplary method for determining relationships between objects in a physical environment using a semantic mesh according to some implementations.

FIG. 4 is a flowchart illustrating an exemplary method for determining relationships between objects in a physical environment using a semantic mesh according to some implementations. In some implementations, the method 400 is performed by a device (e.g., controller 100 or electronic device 120 of FIGS. 1-3). The method 400 can be performed at a television, set-top box, mobile device, HMD, desktop, laptop, server device, or by multiple devices in communication with one another. In some implementations, the method 400 is performed by processing logic, including hardware, firmware, software, or a combination thereof. In some implementations, the method 400 is performed by a processor executing code stored in a non-transitory computer-readable medium (e.g., a memory).

At block 402, the method 400 generates a semantic mesh. The 3D shape of the semantic mesh represents surfaces of objects of a physical environment and at least some of the vertices of the original semantic mesh have semantic labels identifying object type (e.g., table, chair, vase, etc.). In such a mesh, for example, vertices on the floor surface may be labelled "floor", vertices on a chair's surfaces may be labelled "chair."

In some implementations, generating a semantic mesh involves estimating depths of different portions (e.g., pixels) of multiple images of a physical environment, correlating relationships (e.g., transforms) between poses of a camera used to capture the images, and generating a 3D mapping or other reconstruction of surfaces in the physical environment. Such a mapping/reconstruction may include locations in a 3D coordinate system for different surface points. In some implementations, a 3D triangle-based mesh is generated and each vertex of the mesh stores or otherwise is associated with a location, e.g., x,y,z positional information. One or more machine learning algorithms may be used to generate a 3D reconstruction.

In some implementations, generating a semantic mesh involves techniques that do not utilize a machine learning model. For example, one exemplary method uses an algorithm to project vertices of a 3D reconstruction mesh onto semantic segmentation images from different viewpoints and then uses a majority voting technique to determine final vertices labels.

In some implementations, semantic information is included in or added to a 3D reconstruction of a physical environment. One or more machine learning models may be used to classify objects, include, or add semantic information to a 3D reconstruction. In some implementations, a machine learning model is used to generate semantic labels for pixels of one or more images of the physical environment. Such semantic labels may be associated with corresponding portions of a 3D reconstructions based on determining associations between images and the 3D reconstruction. In some implementations, a machine learning model uses a 3D reconstruction and semantically labelled images (e.g., automatically labelled images) as input to produce a semantically-labeled mesh, e.g., a semantic mesh having at least some vertices that are associated with semantic labels.

At block 404, the method 400 transforms the semantic mesh into a graph. This may involve converting the vertices of the semantic mesh to nodes and determining edges connecting nearby nodes to one another. The edges of the graph may represent the sides of the faces of the semantic mesh. The nodes may store information about the coordinates (e.g., x, y, z coordinates), semantic labels, and other information extracted from the semantic mesh.

Figure 5:
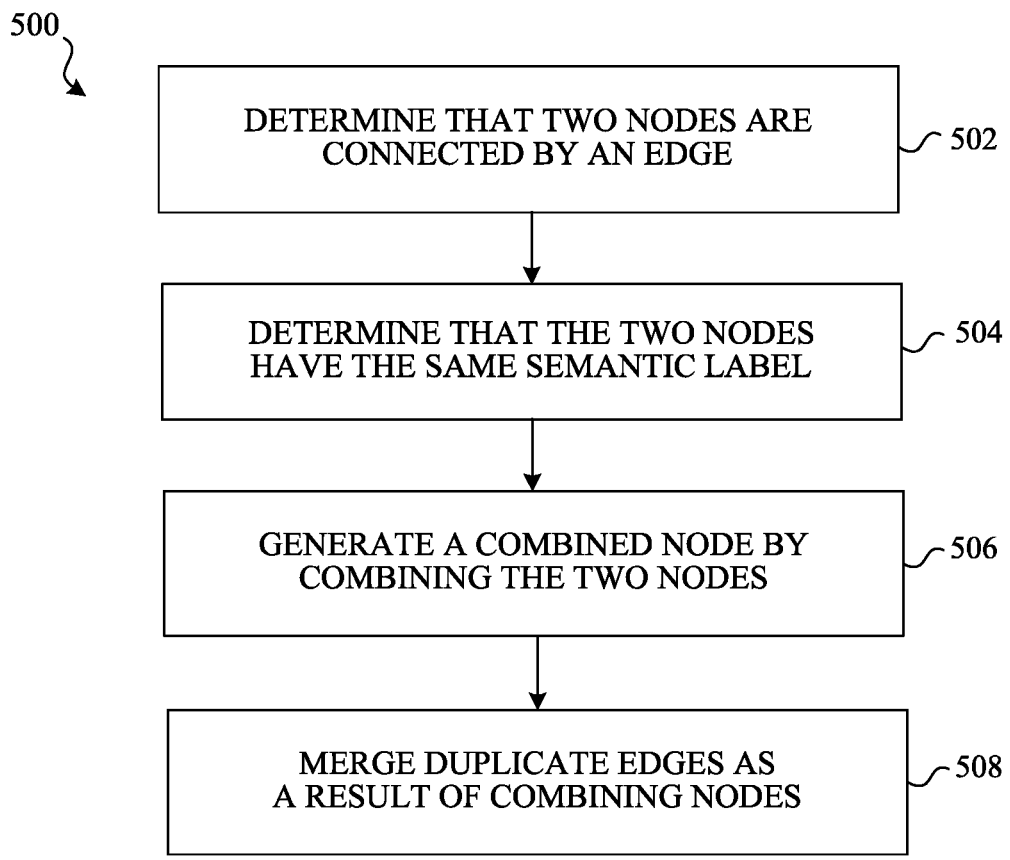
FIG. 5 is a block diagram illustrating an exemplary method for creating a reduced version of a semantic mesh.

At block 406, the method 400 performs graph reduction and instance detection. Graph reduction may reduce the complexity of original semantic mesh or the graph representing the original semantic mesh, for example, reducing the number of nodes in such a graph. FIG. 5 provides an exemplary graph reduction technique. Instance detection involves identifying or estimating separate instances of objects in the semantic mesh or graph representing the semantic mesh. In some implementations, instance detection is performed using a machine learning model that utilizes semantic locations and 3D locations of nodes of the graph to identify instances.

At block 408, the method 400 uses a machine learning model to estimate relationships between objects of the semantic mesh or graph representing the semantic mesh. Examples of relationships include, but are not limited to, estimations that a first object is on top of a second object, a first object is under a second object, a first object is next to a second object, a first object is in contact with a second object, a first object is attached to a second object, a first object is leaning on a second object, a first object (e.g., a person) is holding a second object, a first object is within a second object, a first object is hanging from a second object, a first object is close to a second object, a first object is facing towards a second object, a first object is facing away from a second object, a first object is in front of a second object, a first object is behind a second object, and a first object and a second object are aligned with one another.

In some implementations, the relationships between objects that are produced by the machine learning model are estimated as probabilities, e.g., providing a 99% chance that table T1 is on top of floor F1, a 90% chance that container C1 on top of table T1, a 75% chance that chair C1 is next to table T1, a 75% chance that chair C2 is facing television TV1, a 75% chance that handle H1 is attached to door D1, etc.

An image of the physical environment and/or pose information about the position and orientation of a camera capturing the image may additionally be input to the machine learning model to further improve its accuracy or efficiency. Camera pose information may be used to produce viewpoint specific relationships. For example, if a computer-generated reality (CGR) environment is being produced using live images, the pose (e.g., location and orientation) of the user's current device may be used to facilitate a viewpoint specific relationship determination, e.g., identifying that, from the user's current viewpoint, the chair is in front of the table.

Figure 9:
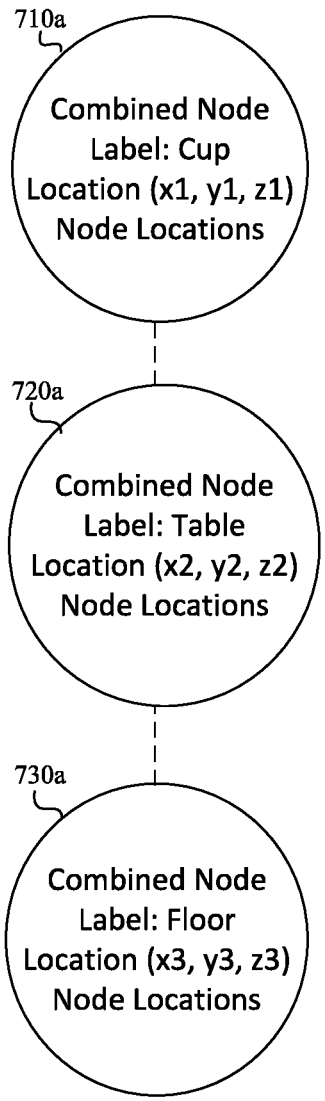
FIG. 9 is a block diagram illustrating a reduced version of the semantic mesh of FIG. 8 according to some implementations.

In some implementations, the machine learning model outputs a graph representing the objects and their relationships. FIG. 9 illustrates an object relationship graph 920 that may be output by method 400. In some implementations, the machine learning model outputs pairwise relationships between objects. A relationship between two or more objects may be represented in any suitable format for output and use.

At block 408, the method 400 uses a machine learning model to object classification labels of vertices of the semantic mesh or nodes of the graph representing the semantic mesh. In some implementations, the relationships between objects are used as input to update the labels of vertices of a semantic mesh or nodes of a graph representing the semantic mesh. In some implementations, the machine learning model used to update the classification labels is a classifier implemented using a neural network.

In some implementations, the objects and/or relationships estimated during method 400 and other techniques disclosed herein are used to facilitate the provision of a computer-generated reality (CGR) environment. A CGR environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality. A virtual reality (VR) environment refers to a simulated environment that is designed to be based entirely on computer-generated sensory inputs for one or more senses. A VR environment comprises virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Examples of mixed realities include augmented reality and augmented virtuality. An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head mounted system may have one or more speaker(s) and an integrated opaque display. Alternatively, a head mounted system may be configured to accept an external opaque display (e.g., a smartphone). The head mounted system may incorporate one or more imaging sensors to capture images or video of the physical environment, and/or one or more microphones to capture audio of the physical environment. Rather than an opaque display, a head mounted system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

In some implementations, the objects classifications and or relationship estimations produced during method 400 and other techniques disclosed herein are used to facilitate the provision of a computer-generated reality (CGR) environment. For example, during the presentation of a CGR environment, input may be received to position a virtual object in the CGR environment that includes objects classified and relationships estimated by method 400 and other techniques disclosed herein. For example, a user may provide a voice command to "put a virtual gyroscope on the table next to the wall." The CGR unit providing the CGR environment (e.g., CGR unit 246 of FIG. 2 or CGR unit 346 of FIG. 3) may determine a position for the virtual object in the CGR environment based on the input and the relationships between the objects that were provided by method 400 or other technique disclosed herein. For example, it may identify table T1 to automatically place the virtual gyroscope on rather than table T2 based on determining that there is a relationship "table T1 is next to wall W1" that best matches the input "the table next to the wall." The virtual object, e.g., the virtual gyroscope, may then be positioned automatically at an appropriate position in the CGR environment for the user to experience.

In some implementations, the semantic mesh or graph representing the semantic mesh is reduced to have fewer vertices/nodes. FIG. 5 is a block diagram illustrating an exemplary method for creating a reduced version of a graph. In some implementations, the method 500 is performed by a device (e.g., controller 100 or electronic device 120 of FIGS. 1-3). The method 500 can be performed at a mobile device, HMD, desktop, laptop, server device, or by multiple devices in communication with one another. In some implementations, the method 500 is performed by processing logic, including hardware, firmware, software, or a combination thereof. In some implementations, the method 500 is performed by a processor executing code stored in a non-transitory computer-readable medium (e.g., a memory).

At block 502, the method 500 involves determining that two nodes are connected by an edge. This can be accomplished, in some implementations, by an inspection or traversal on the semantic mesh. At block 504, the method 500 determines that the two nodes have the same semantic label, e.g., that both are labelled "chair," etc. At block 506, the method 500 generates a combined node by combining the two nodes. Any other nodes that were previously connected to either of the two source nodes are connected instead to the combined node. Moreover, the combined node may store or otherwise be associated with an average position of the first node and the second node and/or the individual source node positions, e.g., the first position of the first node and the second position of the second node. At block 508, the method 500 merges duplicate edges as a result of combining nodes.

Figure 6:
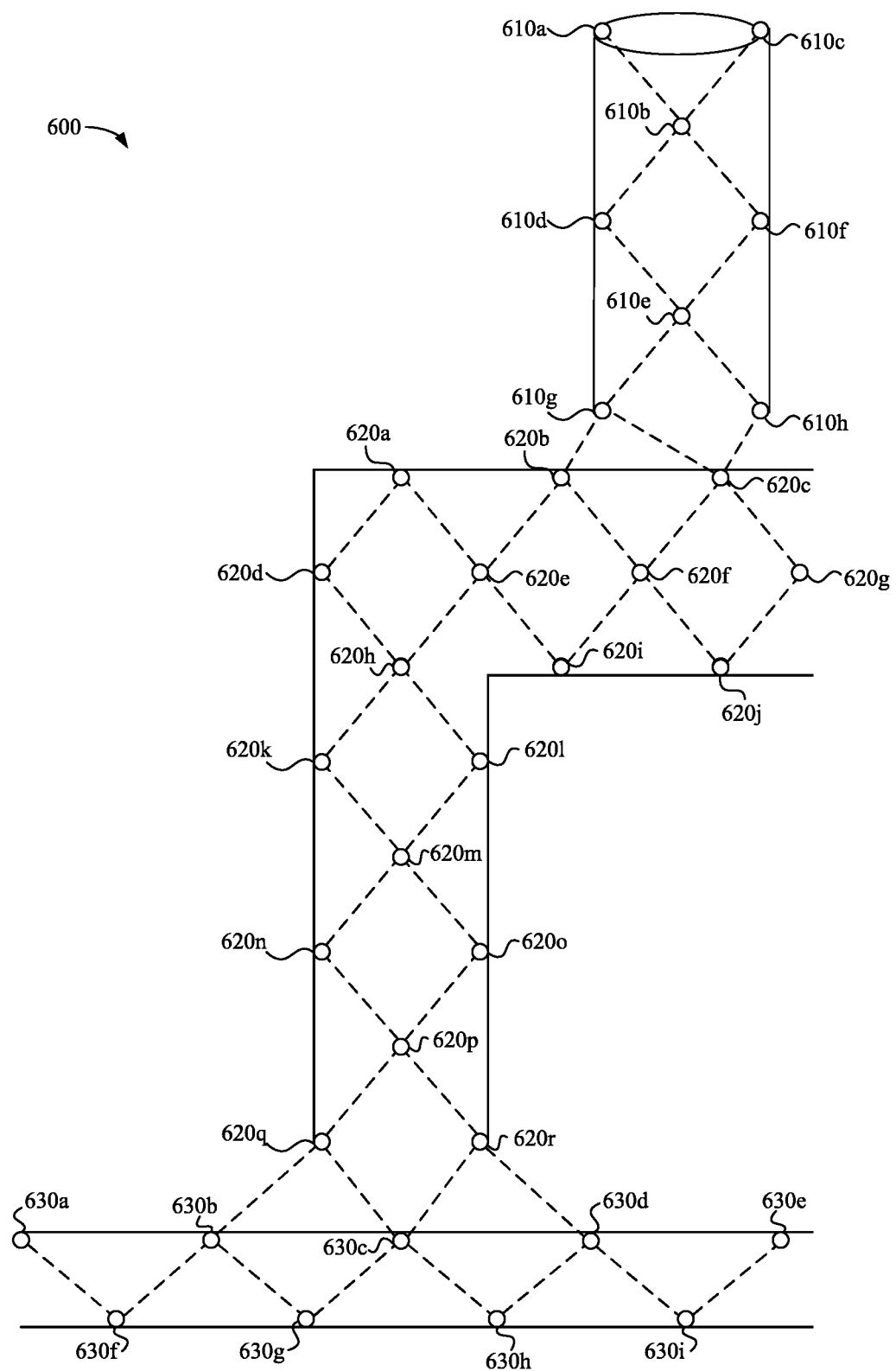
FIG. 6 is a block diagram illustrating an exemplary semantic mesh.

FIGS. 6-9 illustrate reducing an exemplary semantic mesh. FIG. 6 is a block diagram illustrating an exemplary semantic mesh 600. The semantic mesh 600 includes nodes 610a-h, 620a-r, 630a-i connected to one another by edges represented by the dashed lines between the nodes 610a-h, 620a-r, 630a-i. In this example, the nodes 610a-h are semantically labelled "cup", the nodes 620a-r are semantically labelled "table", and the nodes 630a-i are semantically labelled "floor." In a typical use case in an actual physical setting, additional objects and nodes will generally be involved and the semantic mesh will occupy a 3D coordinate space. In the example of FIG. 6 the semantic mesh 600 includes only a limited number of nodes and edges depicted in two dimensions for ease of illustration.

Figure 7:
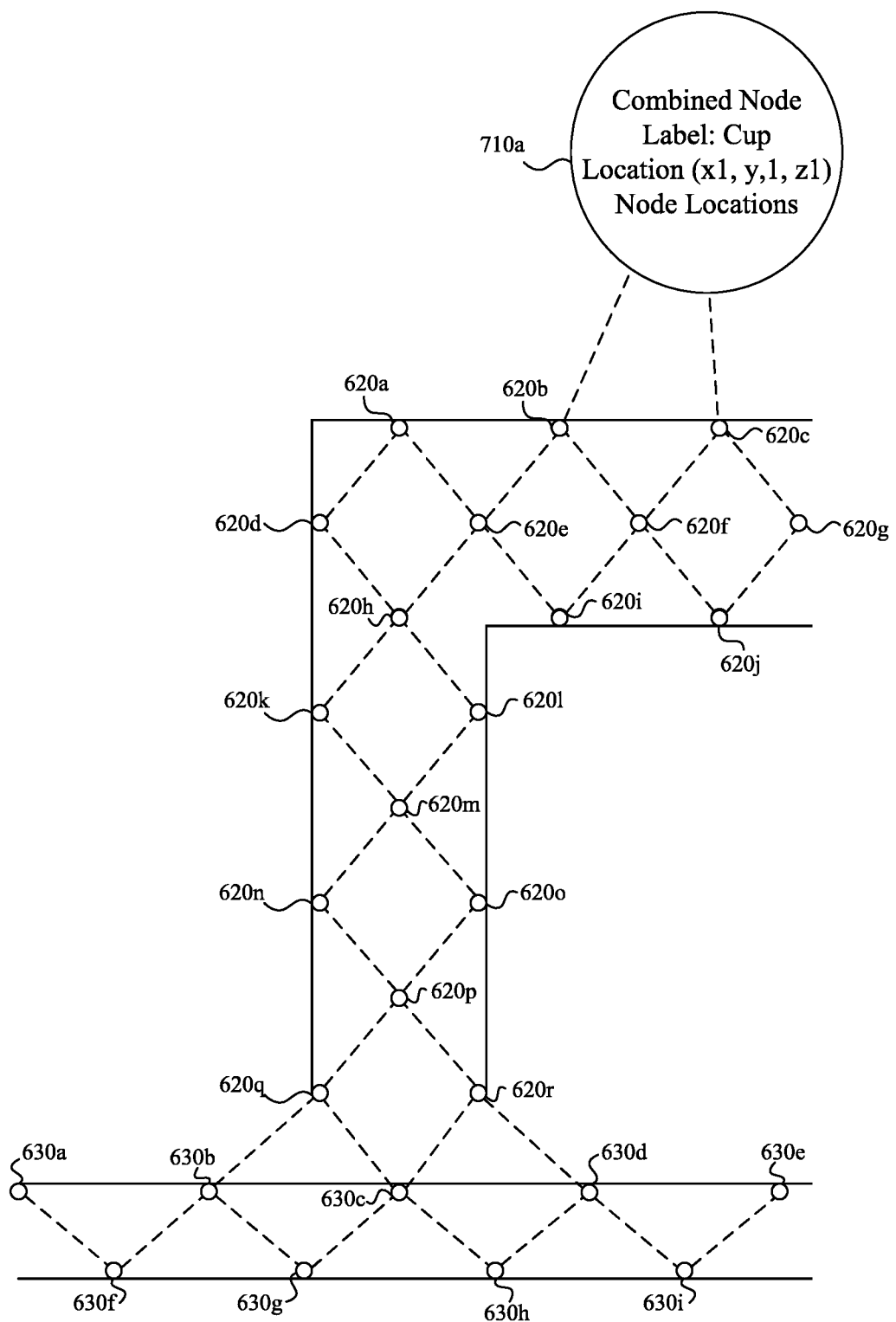
FIG. 7 is a block diagram illustrating a reduced version of the semantic mesh of FIG. 6 according to some implementations.

FIG. 7 is a block diagram illustrating a reduced version of the semantic mesh 600 of FIG. 6. In this example, the nodes 610a-h that were semantically labelled "cup" in FIG. 6 are combined into a single combined node 710a. These nodes 610a-h are combined based on determining that the nodes 610a-h are connected with one another and have the same label. Edges between the nodes 610a-h are thus eliminated. The combined node 710a is given the semantic label "cup" based on the source nodes' labels and is given a location based on the source node locations, e.g., the average location.

Figure 8:
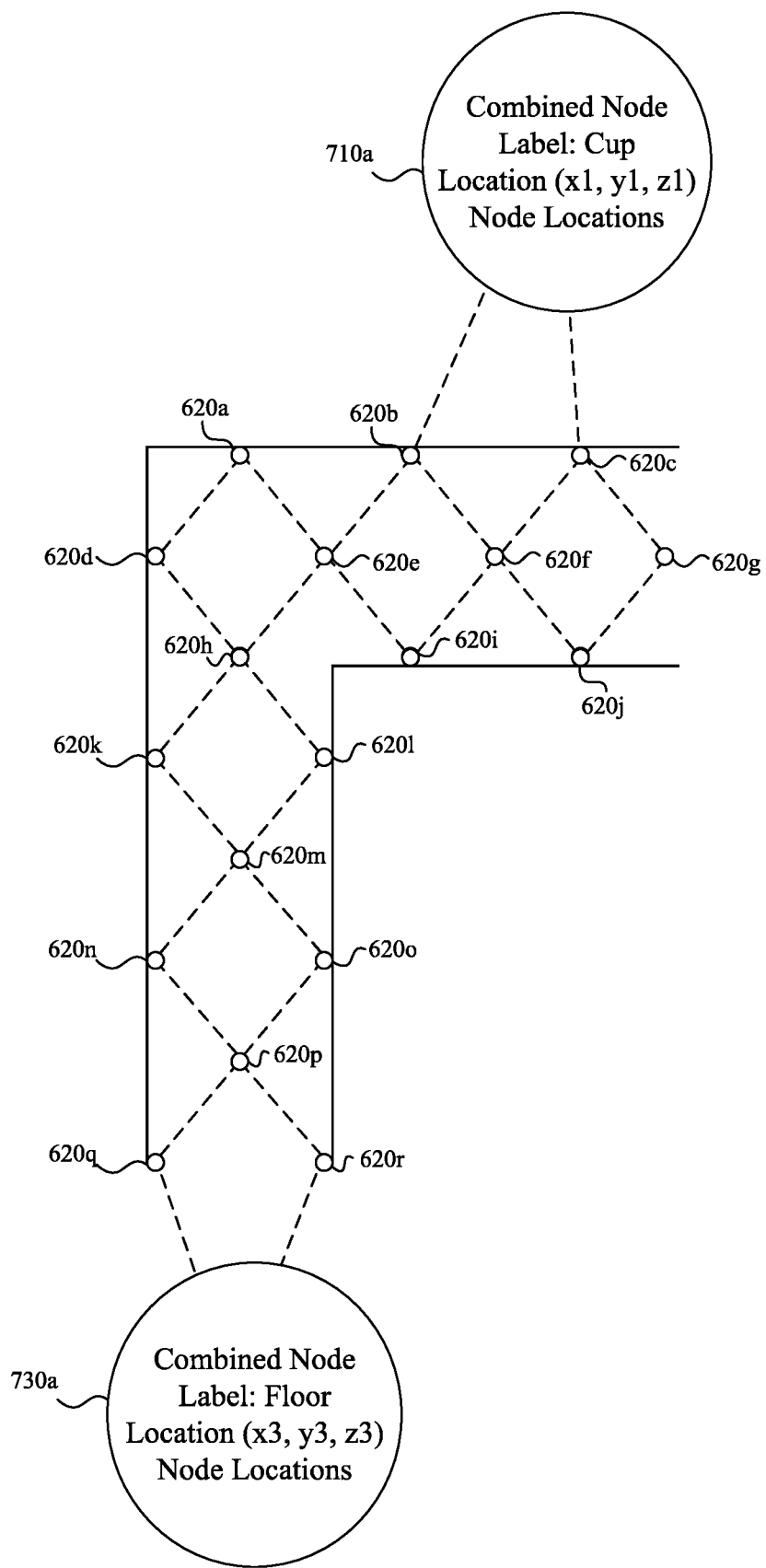
FIG. 8 is a block diagram illustrating a reduced version of the semantic mesh of FIG. 7 according to some implementations.

FIG. 8 is a block diagram illustrating a further reducing the semantic mesh of FIG. 7. In this example, the nodes 630a-i that were semantically labelled "floor" in FIGS. 6 and 7 are combined into a single combined node 730a. These nodes 630a-i are combined based on determining that the nodes 630a-i are connected with one another and have the same label. Edges between the nodes 630a-i are thus eliminated. The combined node 730a is given the semantic label "floor" based on the source nodes' labels and is given a location based on the source node locations, e.g., the average location.

FIG. 9 is a block diagram illustrating a further reducing the semantic mesh of FIG. 8. In this example, the nodes 620a-r that were semantically labelled "table" in FIGS. 6-8 are combined into a single combined node 720a. These nodes 620a-r are combined based on determining that the nodes 620a-r are connected with one another and have the same label. Edges between the nodes 620a-r are thus eliminated. The combined node 720a is given the semantic label "table" based on the source nodes' labels and is given a location based on the source node locations, e.g., the average location.

Figure 10:
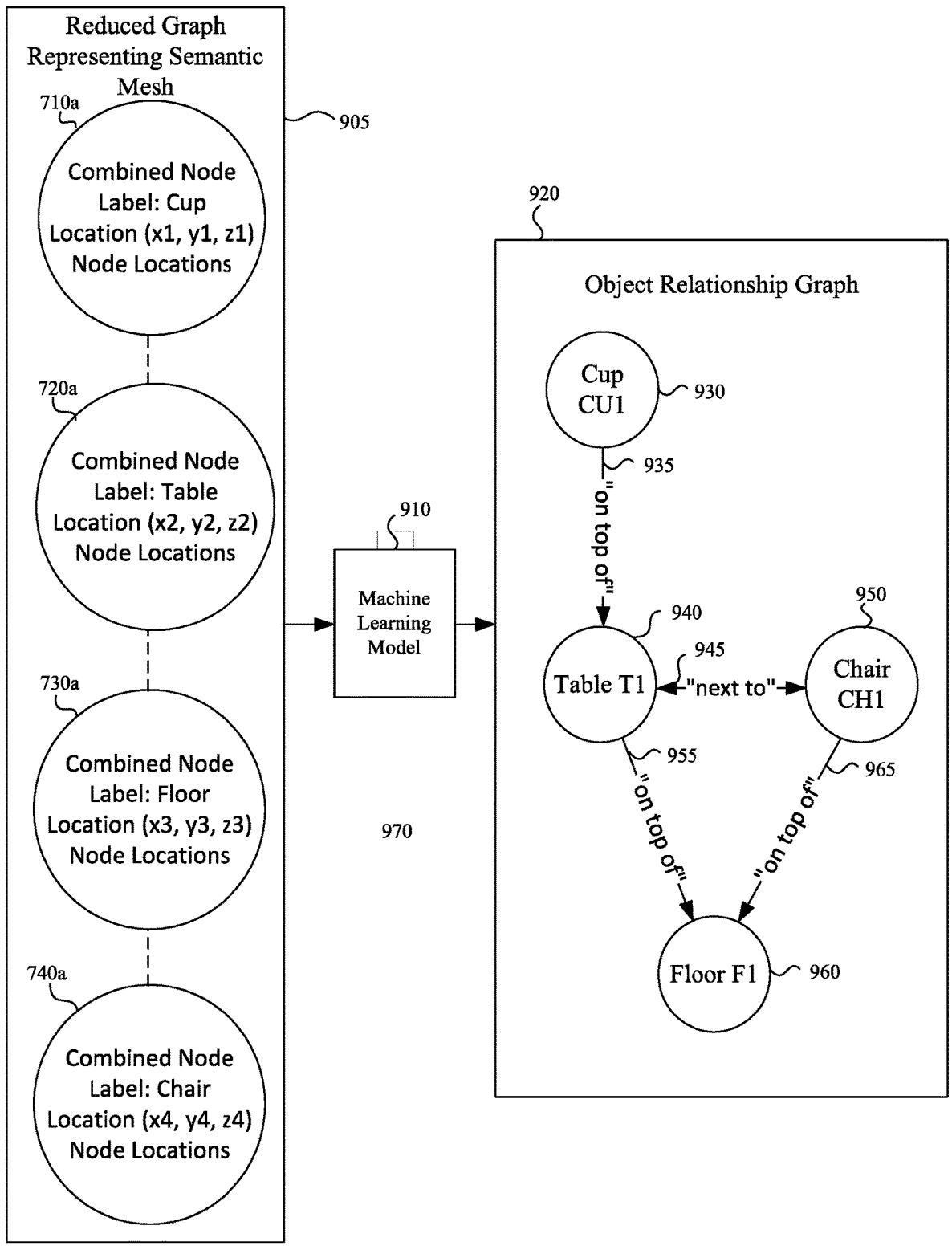
FIG. 10 is block diagram illustrating an exemplary method for determining relationships between objects in a physical environment using a reduced version of a semantic mesh according to some implementations.

FIG. 10 is block diagram illustrating an exemplary method 900 for determining relationships between objects in a physical environment using a reduced version 905 of a semantic mesh. In this example, a semantic mesh is represented by a reduced version of the semantic mesh that includes the combined node 710a, 720a, 730a of the semantic mesh of FIG. 9 and an additional combined node 740a included for illustrative purposes. In this example, the reduced version 905 of the semantic mesh is input to a machine learning model 910 that produces an object relationship graph 920. The machine learning model 910, in some implementations, is neural network trained to produce object relationship graphs given reduced semantic mesh inputs. In some implementations, the machine learning model 910 is a convolutional neural network (CNN). In some implementations, the machine learning model 910 involves recursive learning via a feedback look, for example, including a recurrent neural network (RNN).

In this example, the object relationship graph 920 includes a first object 930, a second object 940, a third object 950, and a fourth object 950. The first object 930 has type label "cup" and instance label "C1." The second object 940 has type label "table" and instance label "T1." The third object 950 has type label "chair" and instance label "CH1." The fourth object 960 has type label "floor" and instance label "F1." In addition, the object relationship graph 920 identifies relationships 935, 945, 955, 965 between the objects 930, 940, 950, 960. The first relationship 935 identifies that the first object 930 is "on top of" the second object 940. The second relationship 945 identifies that the second object 940 is "next to" the third object 950. The third relationship 955 identifies that the second object 940 is "on top of" the fourth object 960. The fourth relationship 965 identifies that the third object 950 is "on top of" the fourth object 960. It should be noted that the edges and nodes illustrated in the object relationship graph 920 need not be limited to holding only one label—two, three, or more labels per node and edge may be produced.

Figure 11:
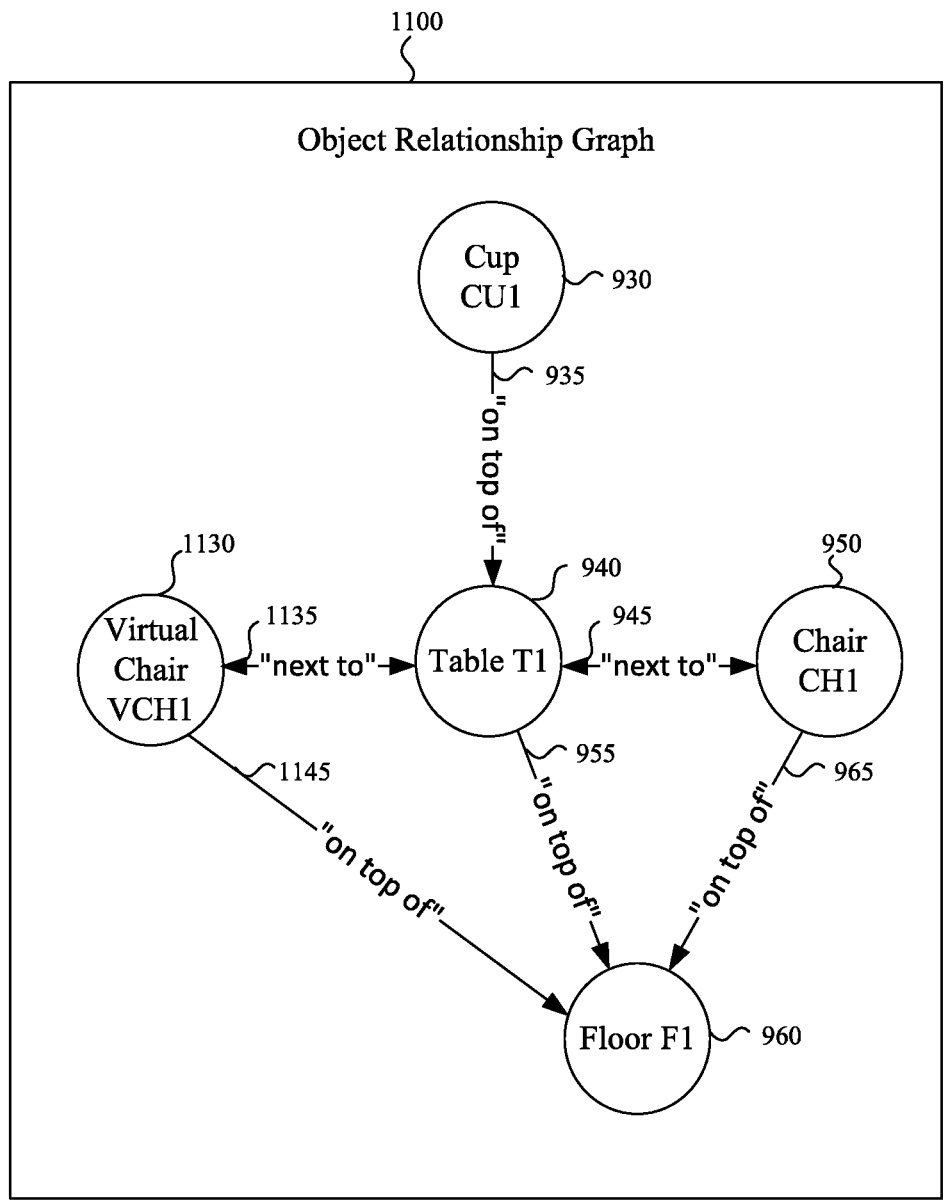
FIG. 11 is a block diagram a graph representing the addition of a virtual object to a CGR environment represented by the object relationship graph of FIG. 10 according to some implementations.

FIG. 11 is a block diagram a graph representing the addition of a virtual object to a CGR environment represented by the object relationship graph of FIG. 10. In this example, a user provides a text or verbal command to "add a virtual chair next to the table." Based on this command, the second object 940 (Table T1) is identified as the table referenced in the command. A virtual chair is automatically added in the CGR environment based on the command and the object relationship graph 1100 is updated to reflect the addition, including the relationship determined based on the command. Specifically, the command identified that the virtual chair should be positioned "next to" the table. Based on this, an automatic location in the CGR environment is selected (e.g., using rules defining, for example, that "next to" triggers placement of objects 6 inches away from, etc.). Moreover, the object relationship graph 1100 is extended to include a new object 1130 (e.g., a virtual chair with type label "chair" and instance label "VCH1"). New relationships are also identified and included in the object relationship graph 1100. Specifically, a fifth relationship 1135 identifies that the new object 1130 is next to the second object 940 and a sixth relationship identifies that the new object 1130 is "on top of" the fourth object 960. Such relationships may be determined based on the command (e.g., the fifth relationship 1135 is determined based on the "next to" in the command). Such relationships may be determined based on algorithms, rules, or machine learning. In this example, the sixth relationship 1145 is determined based on a rule that specifies that if a virtual object is added next to an object that is "on top of" the floor, the virtual object will also be considered to be "on top of" the floor by default.

Figure 12:
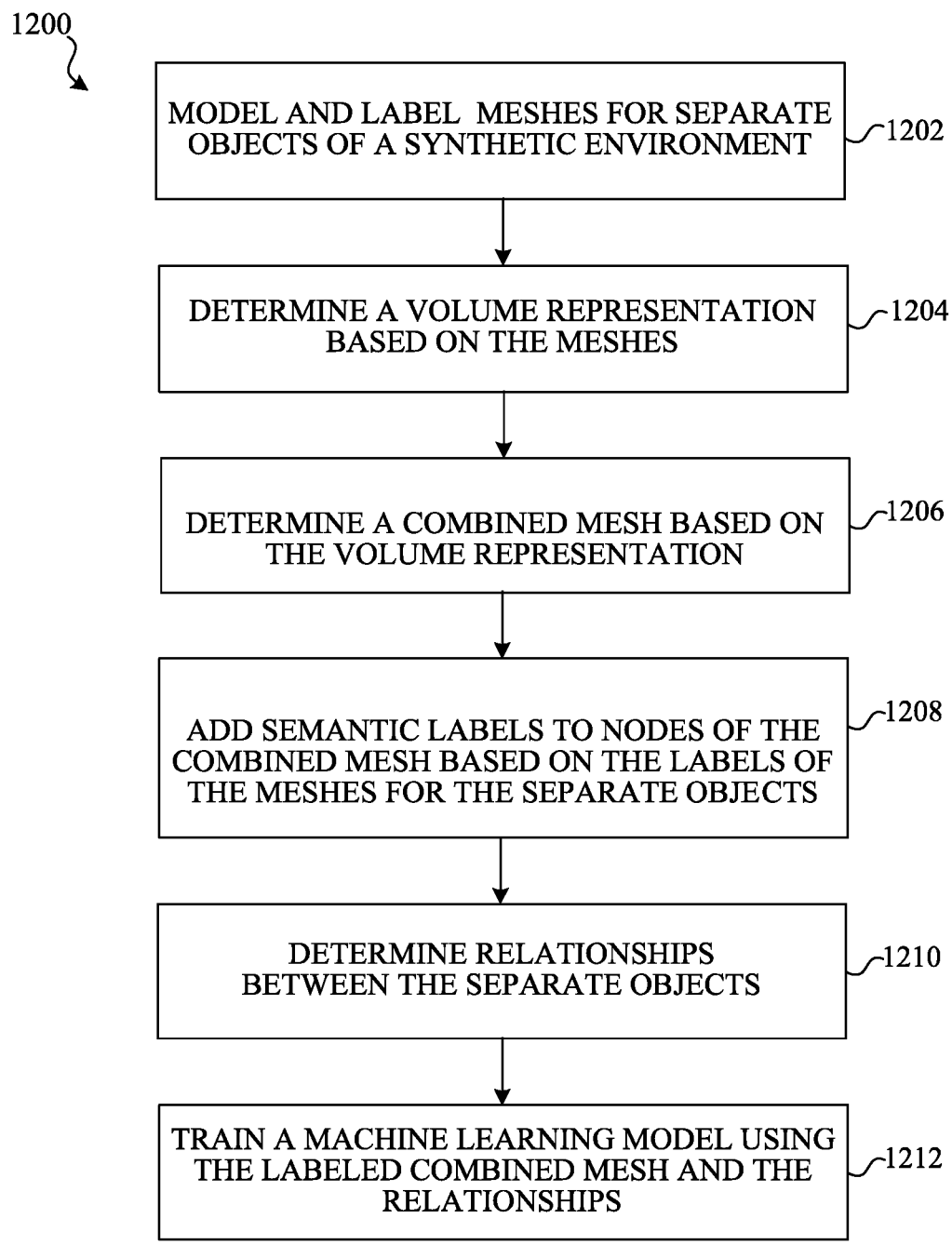
FIG. 12 is a block diagram that illustrates generating synthetic data and training a machine learning model using the synthetic data.

FIG. 12 is a block diagram that illustrates a method 1200 of generating synthetic data and training a machine learning model using the synthetic data. In some implementations, the method 1200 is performed by a device (e.g., controller 100 or electronic device 120 of FIGS. 1-3). The method 1200 can be performed at a television, set-top box, mobile device, HMD, desktop, laptop, server device, or by multiple devices in communication with one another. In some implementations, the method 1200 is performed by processing logic, including hardware, firmware, software, or a combination thereof. In some implementations, the method 1200 is performed by a processor executing code stored in a non-transitory computer-readable medium (e.g., a memory).

At block 1202, the method 1200 models meshes for separate objects of a synthetic environment. The separate objects are associated with object types and the meshes are associated with semantic labels. In some implementations, users manually create example rooms by separately creating a floor, chairs, tables, walls, etc., for each such room.

At block 1204, the method 1200 determines a volume representation based on the plurality of meshes. For example, this may involve converting the individual meshes of the separate objects to form single a density cloud or set of points.

At block 1206, the method 1200 determines a combined mesh based on the volume representation. For example, this may involve converting the density cloud back into a single mesh.

At block 1208, the method 1200 adds semantic labels to nodes of the combined mesh based on the labels of the meshes for the separate objects. For example, the labels from the nodes of chair C1 may be used to label similarly located (e.g., based on locations in 3D space) nodes in the combined mesh.

At block 1210, the method determines relationships between the separate objects. In some implementations, this involves determining whether a first object of the separate objects is in contact with a second object of the separate objects (e.g., to determine whether the objects are touching, contacting, etc.). In some implementations, this involves determining whether a first position of a first object of the separate objects satisfies a distance-based threshold condition with respect to a second position of a second object of the separate objects (e.g., to determine whether the objects are attached, near, next to, etc.). In some implementations, this involves determining whether a first position of a first object of the separate objects satisfies an orientation-based threshold condition with respect to a second position of a second object of the separate objects (e.g., to determine whether the objects are facing, on top of, beneath, etc.).

In some implementations, the relationships are determined by determining a first bounding box associated with a first object of the separate objects, determining a second bounding box associated with a second object of the separate objects, and determining a relationship by comparing the first bounding box and the second bounding box (e.g., to determine whether an object encloses or is within another object, etc.).

In some implementations, determining the relationships involves generating rays based on a position of a first objects, determining intersections of the rays with a second object of the separate objects, and determining a relationship based on the intersections.

At block 1212, the method 1200 trains a machine learning algorithm using the labelled combined mesh and the relationships. For example, the combined mesh and relationships may provide synthetic data that may be used to train a machine learning model to classify objects and estimate relationships from semantic meshes using the techniques disclosed herein. In some implementations, a combined mesh and an object relationship graph are used as input and ground truth respectively to train a machine learning model. The combined mesh and estimated relationships may be used for alternative or additional purposes.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing the terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more implementations of the present subject matter. Any suitable programming, scripting, or other type of language or combinations of languages may be used to implement the teachings contained herein in software to be used in programming or configuring a computing device.

Implementations of the methods disclosed herein may be performed in the operation of such computing devices. The order of the blocks presented in the examples above can be varied for example, blocks can be re-ordered, combined, or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or value beyond those recited. Headings, lists, and numbering included herein are for ease of explanation only and are not meant to be limiting.

It will also be understood that, although the terms "first," "second," etc. may be used herein to describe various objects, these objects should not be limited by these terms. These terms are only used to distinguish one object from another. For example, a first node could be termed a second node, and, similarly, a second node could be termed a first node, which changing the meaning of the description, so long as all occurrences of the "first node" are renamed consistently and all occurrences of the "second node" are renamed consistently. The first node and the second node are both nodes, but they are not the same node.

The terminology used herein is for the purpose of describing particular implementations only and is not intended to be limiting of the claims. As used in the description of the implementations and the appended claims, the singular forms "a," "an," and "the" are intended to include the plural forms as well, unless the context clearly indicates otherwise. It will also be understood that the term "or" as used herein refers to and encompasses any and all possible combinations of one or more of the associated listed items. It will be further understood that the terms "comprises" or "comprising," when used in this specification, specify the presence of stated features, integers, steps, operations, objects, or components, but do not preclude the presence or addition of one or more other features, integers, steps, operations, objects, components, or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description and summary of the invention are to be understood as being in every respect illustrative and exemplary, but not restrictive, and the scope of the invention disclosed herein is not to be determined only from the detailed description of illustrative implementations but according to the full breadth permitted by patent laws. It is to be understood that the implementations shown and described herein are only illustrative of the principles of the present invention and that various modification may be implemented by those skilled in the art without departing from the scope and spirit of the invention.

What is claimed is:

1. A method comprising:
   at an electronic device having a processor:
   generating a semantic mesh of vertices defining faces representing 3D positions of surfaces of objects of a physical environment, at least some of the vertices having semantic labels identifying object type;
   transforming the semantic mesh into a graph representing the semantic mesh, wherein vertices of the semantic mesh are represented by nodes of the graph and positional relationships between the nodes are determined from the 3D positions and represented by edges of the graph;
   determining a reduced graph representation by combining nodes of the graph connected by edges and having a same semantic label;
   identifying relative spatial relationships between the objects using the reduced graph representation; and
   providing a computer-generated reality (CGR) environment that includes the objects, wherein the CGR environment is provided based on the relative spatial relationships between the objects.

2. The method of claim 1 further comprising determining the reduced graph representation by removing nodes in the graph.

3. The method of claim 2, wherein nodes are removed based on removing edges between nodes having a same semantic label.

4. The method of claim 2, wherein nodes are removed by:
   determining that a first node and a second node are connected by an edge;
   determining that the first node and second node have a same semantic label;
   generating a combined node by combining the first node and the second node; and
   merging duplicate edges as a result of combining nodes.

5. The method of claim 4, wherein the combined node identifies an average position of a position associated with the first node and a position associated with the second node.

6. The method of claim 4, wherein the combined node identifies a first position of the first node and a second position of the second node.

7. The method of claim 1, wherein at least some of the nodes are semantically labelled floor, table, chair, wall, or ceiling.

8. The method of claim 1, wherein the graph comprises edges connecting nodes associated with a same semantic label and edges connecting nodes associated with different semantic labels.

9. The method of claim 1, wherein identifying the relative spatial relationships comprises identifying probabilities of the objects being associated by the relative spatial relationships.

10. The method of claim 1, wherein a relationship of the relative spatial relationships identifies:
    a first object on top of a second object;
    the first object next to the second object;
    the first object facing the second object; or
    the first object attached to the second object.

11. The method of claim 1, wherein identifying the relative spatial relationships between the objects comprises inputting into a machine learning model:
    the reduced graph representation;
    an image of the physical environment; and
    a pose associated with a viewpoint in the physical environment.

12. The method of claim 1 further comprising providing a graph representing the objects and the relationships.

13. The method of claim 1 further comprising:
    receiving input to position a virtual object in the environment that includes the objects; and
    determining a position for the virtual object in the CGR environment based on the input and the relationships between the objects.

14. The method of claim 1 further comprising updating object classification labels of nodes of the reduced graph representation of the graph using a machine learning model.

15. The method of claim 1, wherein identifying the relative spatial relationships between the objects comprises using a machine learning model that is trained using training data, the training data generated by:
   modeling a plurality of meshes for separate objects of a synthetic environment, the separate objects associated with object types and the meshes associated with semantic labels;
   determining a volume representation based on the plurality of meshes;
   determining a combined mesh based on the volume representation; and
   determining relationships between the separate objects.

16. A system comprising:
   a non-transitory computer-readable storage medium; and
   one or more processors coupled to the non-transitory computer-readable storage medium, wherein the non-transitory computer-readable storage medium comprises program instructions that, when executed on the one or more processors, cause the system to perform operations comprising:
   generating a semantic mesh of vertices defining faces representing 3D positions of surfaces of objects of a physical environment, at least some of the vertices having semantic labels identifying object type;
   transforming the semantic mesh into a graph representing the semantic mesh, wherein vertices of the semantic mesh are represented by nodes of the graph and positional relationships between the nodes are determined from the 3D positions and represented by edges of the graph;
   determining a reduced graph representation by combining nodes of the graph connected by edges and having a same semantic label;
   identifying relative spatial relationships between the objects using the reduced graph representation; and
   providing a computer-generated reality (CGR) environment that includes the objects, wherein the CGR environment is provided based on the relative spatial relationships between the objects.

17. The system of claim 16, wherein the operations further comprise determining the reduced graph representation by removing nodes in the graph.

18. The system of claim 17, wherein nodes are removed based on removing edges between nodes having a same semantic label.

19. The system of claim 17, wherein nodes are removed by:
   determining that a first node and a second node are connected by an edge;
   determining that the first node and second node have a same semantic label;
   generating a combined node by combining the first node and the second node; and
   merging duplicate edges as a result of combining nodes.

20. A non-transitory computer-readable storage medium, storing program instructions computer-executable on a computer to perform operations comprising:
   generating a semantic mesh of vertices defining faces representing 3D positions of surfaces of objects of a physical environment, at least some of the vertices having semantic labels identifying object type;
   transforming the semantic mesh into a graph representing the semantic mesh, wherein vertices of the semantic mesh are represented by nodes of the graph and positional relationships between the nodes are determined from the 3D positions and represented by edges of the graph; and
   determining a reduced graph representation by combining nodes of the graph connected by edges and having a same semantic label;
   identifying relative spatial relationships between the objects using the reduced graph representation; and
   providing a computer-generated reality (CGR) environment that includes the objects, wherein the CGR environment is provided based on the relative spatial relationships between the objects.

* * * * *